(12) United States Patent
Burden

(10) Patent No.: US 6,484,301 B1
(45) Date of Patent: Nov. 19, 2002

(54) SYSTEM FOR AND METHOD OF EFFICIENT CONTACT PAD IDENTIFICATION

(75) Inventor: David C Burden, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/865,268

(22) Filed: May 25, 2001

(51) Int. Cl.[7] ............................................. G06F 17/50
(52) U.S. Cl. ................... 716/8; 716/15; 716/19
(58) Field of Search .................. 716/8, 15, 21, 716/19

(56) References Cited

U.S. PATENT DOCUMENTS 4,343,877 A * 8/1982 Chiang ........................ 257/48
5,581,475 A * 12/1996 Majors ........................... 716/8
5,666,722 A     9/1997 Tamm et al. ................. 29/847
6,004,619 A    12/1999 Dippon et al. ............... 427/97
6,317,859 B1 * 11/2001 Papadopoulou ............... 716/8

* cited by examiner

Primary Examiner—Huan Hoang

(57) ABSTRACT

The present invention includes a system for and a method of identifying the location of contact pads on interconnect layers of printed circuit boards or metal layers of integrated circuits. The invention groups the conductive surfaces into rectangular areas and applies a mask to the identified rectangular areas by aligning a corner of the mask with the corresponding corner of the rectangular area. Once aligned, the remaining corners of the mask are checked to see whether there is an underlying conductive material present at all corners thereby identifying a suitable location for a contact pad. The invention further includes an alignment of alternate corners of the mask with the corresponding corner of the rectangular area if previous attempts to identify a contact pad were unsuccessful.

20 Claims, 5 Drawing Sheets

```
      pair<bool, PhysPoint>
     Wire placer::fitBinA (vector<PhysRect *> * a, const PhysSize b) {
  /  assert (a);
501
      pair<bool, Phys Point>ret_val;
      ret_val. first = false;

vector<PhysRect *>::iterator rectsIt, rectsIt2, rectsEnd;
      rectsEnd = a ->end ( );

for (rectsIt = a ->begin ( ); rectsIt != rectsEnd; ++rectIt) {
  /     // Try the lower left of this rectangle as the return value,
500     //and see if the other three corners of a rectangle the
        //size of "b" will fit in the rectangles in "a."

ret_val.second = (*rectsIt) ->11 ( );
  /  PhysPoint ul, lr, ur;
502  ⎛ul . x = ret_val . second . x;
     ⎜ul . y = ret_val . second . y + b . y;
     ⎪lr . x = ret_val . second . x +b . x;
503 ⎨lr . y = ret_val . second . y;
     ⎪ur . x =lr.x;
     ⎝ur . y = ul . y;

bool lrContained, ulContained, urContained;
     lrContained = ulContained = urContained = false;

for (rectsIt2 = a ->begin ( ); rectsIt2 ! = rectsEnd; rectsIt2++) {
       if (!ulContained) if ((*rectsIt2) ->contains (ul)) ulContained = true;
       if (!lrContained) if ((*rectsIt2) ->contains (lr)) lrContained = true;
       if (!urContained if ((*rectsIt2) ->contains (ur)) urContained = true;
       if (ulContained && lrContained && urContained) break;
     }
     if (ulContained && lrContained && urContained) {
       ret_val . first = true;
        break;
     }
   }return ret_val;
  }
```

*FIG. 5*

SYSTEM FOR AND METHOD OF EFFICIENT CONTACT PAD IDENTIFICATION

BACKGROUND

Multilayer circuit boards and integrated circuits are well known in the art. Currently, printed circuit boards can contain 8 metal layers and are typically designated Metal 1 through Metal 8. Each layer includes conductive material. To simplify interconnect design, typically, the conductive material in each layer runs in a specific lengthwise direction parallel to the length or width of the substrate (e.g., PC board or chip die) where the direction between successive layers alternates in direction. For instance, Metal 1 may include conductive material which runs in the "x" direction, while Metal 2 includes conductive material which runs only in the "y" direction and Metal 3 includes conductive material which runs only in the "x" direction. Typically, various layers in a printed circuit board or the wiring layer of an integrated circuit are electrically connected to one another by boring or etching a hole between the layers which are to be connected and filling all or a portion of that hole with a metal conductor which connects the conductive material (i.e., wiring) of the first layer with the conductive material of the second layer.

For example, a hole may be drilled in Metal 2 and a connection may be made between the conductive material in Metal 2 and the conductive material in Metal 1. Multilayer boards are well known in the art and connections between various layers of multilevel boards are described in detail in U.S. Pat. No. 5,666,722 issued to Tamm et al. on Sep. 16, 1997 and U.S. Pat. No. 6,004,619 issued to Dippon et al. on Dec. 21, 1999, both of which are incorporated in their entirety herein and are assigned to the assignee of the present patent application. Typically, on each connected layer, a contact pad is included to ensure that the hole drilled between the layers contacts the conductive material on each of the layers. Such contact pads are usually wider than the minimum wiring width in part, so that when the through hole is formed, sufficient material surrounds the hole so that the wiring is not broken and sufficient area is provided to join or bond the metal conductor (or "jumper") to the interconnecting layer.

SUMMARY OF THE INVENTION

The present invention is directed to a system and method which identifies the location of contact pads on interconnect layers of printed circuit boards or metal layers of integrated circuits. The invention groups the conductive surfaces into rectangular areas and applies a mask to the identified rectangular areas by aligning a corner of the mask with the corresponding corner of the rectangular area. Once aligned, the remaining corners of the mask are checked to see whether there is an underlying conductive material present at all corners thereby identifying a suitable location for a contact pad. A further embodiment of the invention includes an alignment of alternate corners of the mask with the corresponding corner of the rectangular area if previous attempts to identify a contact pad were unsuccessful.

BRIEF DESCRIPTION OF THE DRAWING

FIG. 5 is an example of code used to implement the present invention.

DETAILED DESCRIPTION

Figure 1:
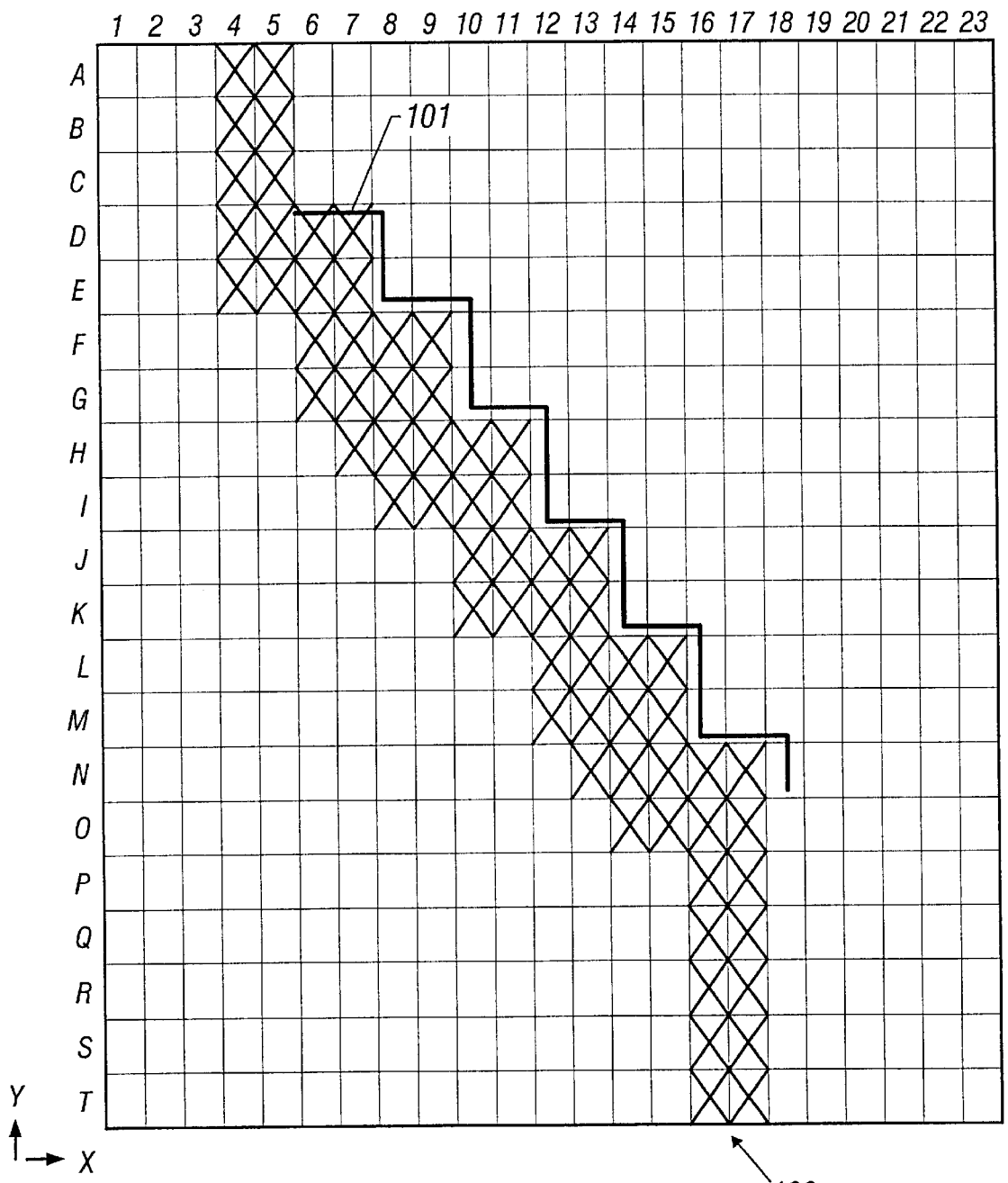
FIG. 1 is an illustration of a wire run on a specific level of a printed circuit board.

FIG. 1 is an illustration of a wire run on a specific level of a substrate such as a printed circuit board (PCB) or integrated circuit chip. In FIG. 1, the grid locations which contain conductive material are indicated by an "X". For ease of reference, the minimum size rectangular unit used to define a conductive layer will be termed a "pixel", even though not necessarily related to a visual picture element or other displayable unit. These minimum size rectangular units may also be referred to as atomic units since they are the smallest metal areas defined when designing, for example, an integrated circuit. In the illustration of FIG. 1, the conductive material is formed to run primarily in the "y" direction. In this example, the width of the conducted paths must be two squares wide. The locations on the conductive layer of the printed circuit board in FIG. 1 have been provided with reference characters for easy reference. Using these grid coordinates, it can be seen that the conductive material begins in position A4, A5 and translates in the "x" direction in roughly a 45° direction. Since the conductive material must always be two squares wide, the translation in the 45° degree angle typically consists of staircase pattern 101 as depicted in FIG. 1.

Contact pads, or areas of the PCB where connections between layers may be made are larger than the width of a wire run. For example, contact pads may be three pixels by three pixels in size. Typically, board designers include locations for contact pads within the board layout and depend on these contact pads to be later identified and used to connect the wire run to other layers. Identification of the contact pads is typically a manual operation. Conductive material 100 is visually examined to identify where a contact pad has been included in the conductive material. Alternatively, an automated examination of the conductive material for contact pads can be performed by a computer. One technique for this examination is for the computer to identify each pixel on the PCB which contains conductive material, and once a pixel with conductive material has been identified, to examine surrounding pixels for additional conductive material.

For example, if a contact pad is defined to be a three by three arrangement, a search program may begin an exhaustive search through each pixel on the PCB to identify contact pads by using a mask corresponding to the geometry of the contact pad. The program may begin on pixel A1 of FIG. 1, determine that conductive material is not present on A1, and then go on to examine A2. In FIG. 1, A2 does not contain conductive material, and the program would proceed to examine pixel A3. This process continues until the program identifies a pixel containing conductive material. Once a pixel with conductive material has been identified, the computer program would need to examine the surrounding pixels to determine if a three by three, for this example, contact pad is present. Referring again to FIG. 1, the program would identify the presence of conductive material on pixel A4. The examination of the surrounding pixels would depend on the search routine implemented by the computer program. In this example, since the program began the exhaustive search from the top left (A1) pixel, the computer program would set the pixel element containing conductive material equal to the top left element of the three by three contact pad. This is because the program has already determined that all pixels above and to the left of the current position do not satisfy the three by three criteria of conductive units required to form a pad. Thus, it is not necessary to reexamine the pixels already visited. Once this step is performed the program checks for the presence of conductive material on the other eight pixels comprising the contact pad. This may be accomplished in a number of ways. The computer program may then check the next two pixels in the row (A5 and A6) for the presence of conductive material. In FIG. 1, A5 contains conductive material but pixel A6 does not. Once it was determined that pixel A6 does not contain conductive material, the program would return to pixel A4, and having determined that pixel A4 is not the upper left hand corner of a contact pad, would continue to pixel A5 and continue the search for a contact pad.

In FIG. 1, this search would continue, with the program failing to find a contact pad through pixel rows A, B, C, D, and E. However, when the program reaches pixel F7, conductive material will be found in F8, F9, G7, G8, G9, H7, H8, and H9 and a contact pad is identified. This process shows how a computer can be programmed to conduct an exhaustive search by visiting each pixel to determine if it is contained in a contact pad. One of ordinary skill in the art would understand that the search may begin from any point or from multiple points on the PCB or interconnect layer of a die and the corresponding steps to locate a contact pad would be modified.

Alternatively, when a contact pad has been defined to be, for example, a three by three pixel group, another method of identifying a contact pad is to examine each pixel to determine if it is in the center of the contact pad area. For example, pixel M14 has conductive material applied to it. If pixel M14 were in the middle of a three by three pixel group, the pixel group above, below, to the left and to the right of pixel M14 would also need to include conductive material. Additionally, the diagonal locations from pixel M14 namely L13, L15, N13, and N15 would also require conductive material. An appropriate program checks for possible contact pad placement by examining each pixel location which contains conductive material and checking the eight pixel locations surrounding the pixel to determine if they also contain conductive material. While this method identifies all contact pads with a three by three structure, the program is generally inefficient in its attempts to identify contact pads. This inefficiency would result from its exhaustive search of every pixel or the PCB and its exhaustive search for each pixel in the contact pad generally requiring $O(n^2)$ to complete. Additionally, if the layout of the contact pad size varies, alternate algorithms or programs would need to be developed to identify search techniques for alternate contact pad sizes and arrangements.

Figure 2:
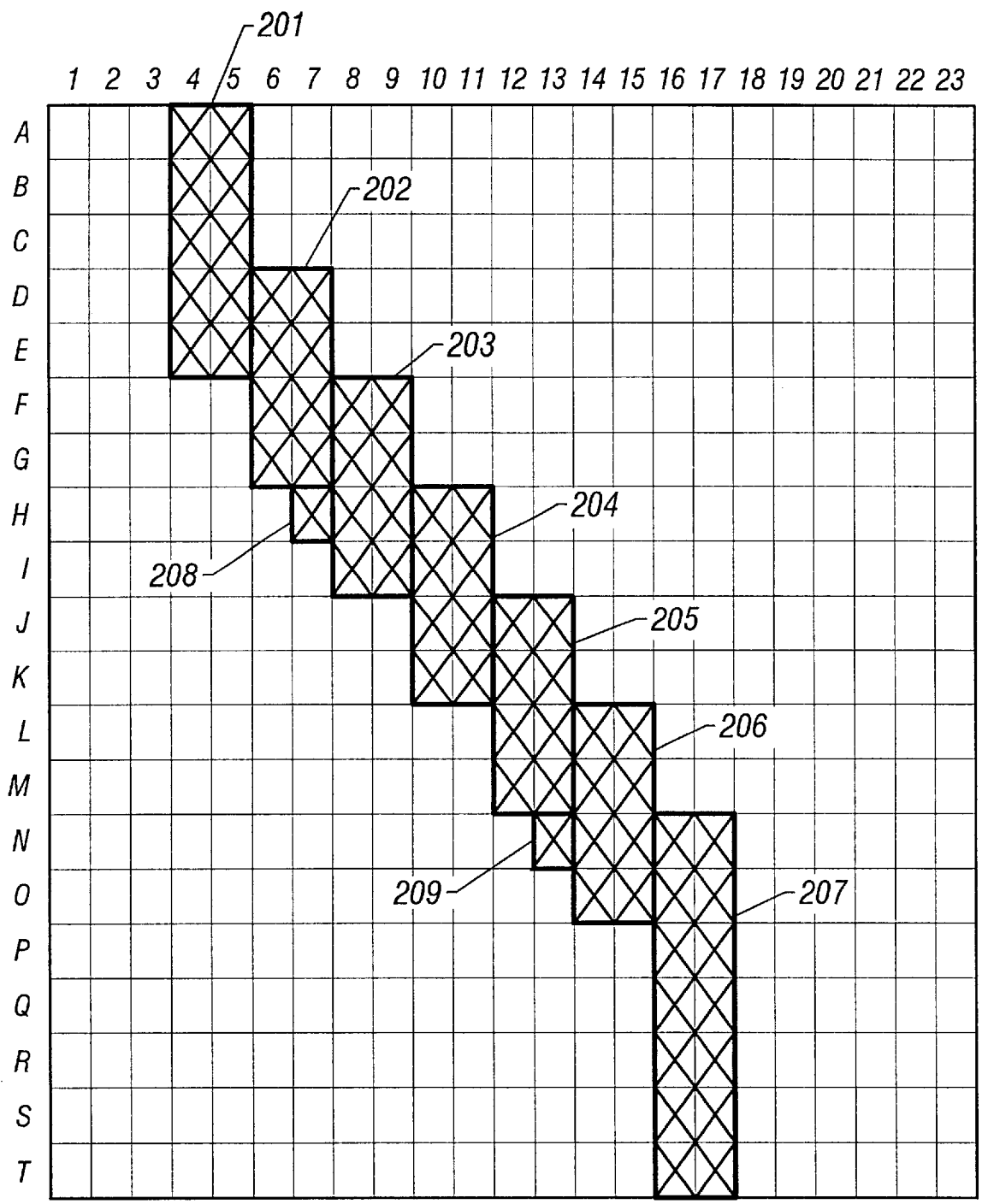
FIG. 2 is an illustration of a grouping into rectangular areas of conductive material on the printed circuit board of FIG. 1.

The conductive material of FIG. 1 may be grouped in several ways to more efficiently search the conductive material present to determine the presence of a contact pad. FIG. 2 illustrates one grouping of the grid locations included in the conductive material. Grid 201 includes A4, A5, B4, B5, C4, C5, D4, D5, E4, and E5. Similarly, area 202 includes grid locations D6, D7, E6, E7, F6, F7, G6 and G7. Areas 203, 204, 205, 206, 207, 208, and 209 have also been illustrated in FIG. 2. The areas identified in FIG. 2 are orientated in a vertical direction as might be used to define conductive segments in a metal layer having conductors running primarily in the vertical direction. The identified rectangular areas, or macroblocks, need not be of equal size or orientation.

Figure 3:
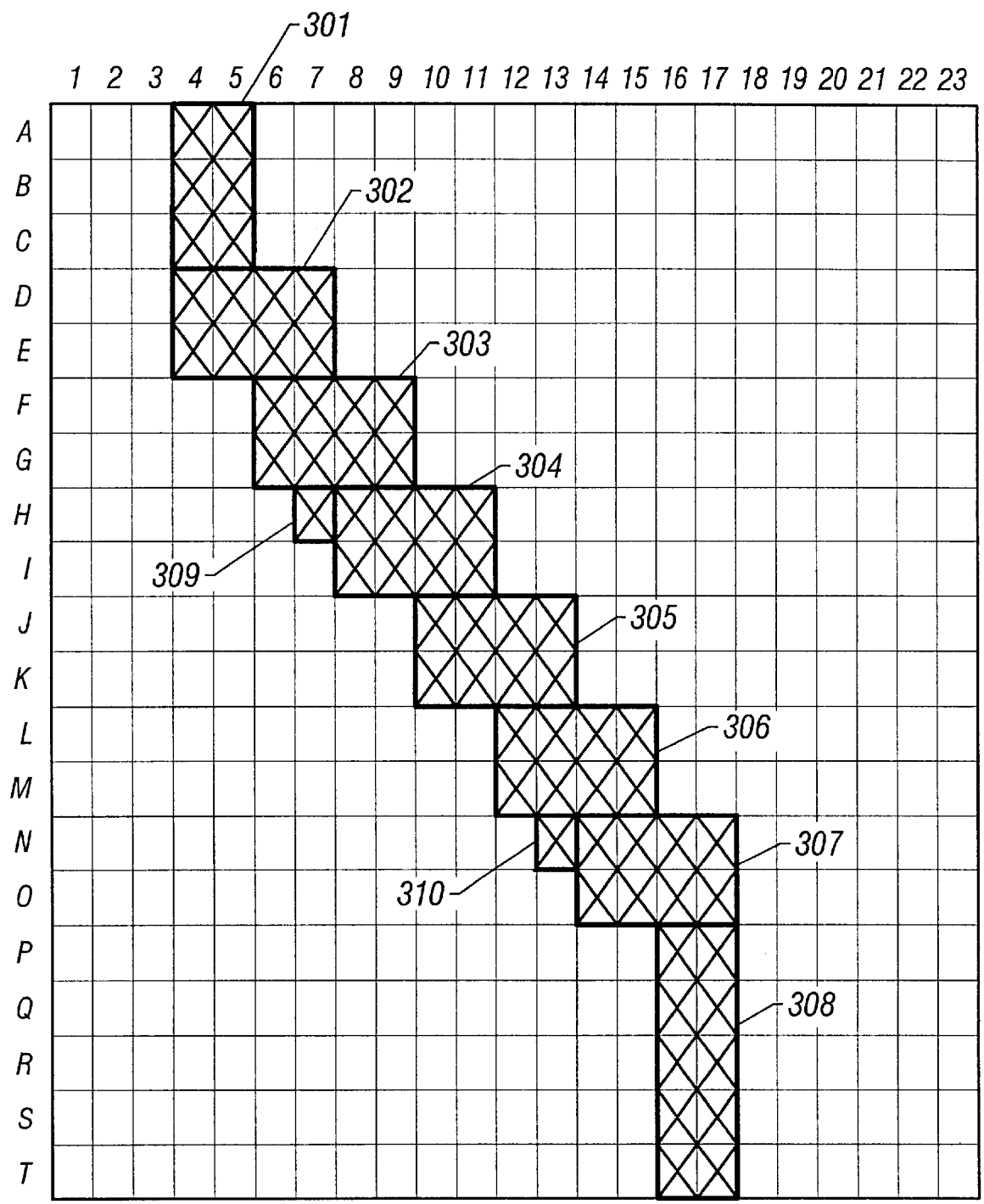
FIG. 3 is an illustration of an alternative grouping of the conductive material on the printed circuit board of FIG. 1.

Alternatively, FIG. 3 illustrates conductive areas which are orientated in a horizontal direction. Area 301 includes A4, A5, B4, B5, C4, and C5. Area 302 includes D4, D5, D6, D7, E4, E5, E6, and E7. Similarly, areas 303, 304, 305, 306, 307, 308, 309 and 310 are similarly illustrated in FIG. 3. Such a grouping might be used in a layer having conductors spanning the horizontal direction of the board or die. As previously indicated, rectangular groupings need not be of equal size or shape.

These areas as defined in FIGS. 2 and 3 are rectangular areas which are examined to identify potential contact pads. As previously described, a contact pad according to the illustration may require a three square by three square area. Referring again to FIG. 2, areas 201, 202, 203, 204, 205, 206, 207, 208 and 209 would each be examined to identify if any of the areas contain a three by three square area for the contact pad placement.

A systematic approach using the rectangular areas identified in the conductive material may be used to efficiently identify potential contact pads. For example, if a three by it three contact pad were required, once areas 201 through 209 were identified, the lower left pixel of each area is examined to determine if that pixel and its surrounding pixels could be used for a contact pad. For example, in area 201, the lower left hand pixel is element E4. If a three by three contact pad were required, and an assumption was made that E4 was the lower left hand corner of the contact pad, D4, C4, C5, C6, D5, D6, E5, and E6 could each be checked to determine if they contain conductive material. If each of these pixels contain conductive material a contact pad has been located.

Alternatively, not every pixel in the three by three array needs to be checked. Spacing requirements on a PCB or IC interconnect realization layer require that runs of conductive material on a layer of the PCB or the die be separated by two or three pixels which do not contain conductive material. In this case, not every pixel of the suspected contact pad needs to be checked for the presence of conductive material. Rather, to reduce computational time, only the corners of a possible contact pad need to be checked, because the pixels in-between the corners necessarily, because of the minimum spacing requirements, must contain conductive material. Therefore, if E4 was assumed to be the lower left hand corner of the three by three contact pad, the other corners of the potential contact pad could be examined to determine if they also contain conductive material. In this case, again assuming a three by three contact pad, pixels C4, C6 and E6 are examined to determine if each of these pixels contains conductive material. In this case, pixel C6 does not contain conductive material so E4 cannot be the lower left hand corner of a contact pad of the specified minimum three by three size.

A computer program embodying this process examines the next area to determine if that area contains a potential contact pad. In this case, area 202 would be examined and element G6, the lower leftmost pixel of the area would be assumed to be the lower left hand corner of the contact pad. For a three by three contact pad, elements E6, E9 and G9 would then be examined to determine if they also contain conductive material. In this manner, each of the areas included in FIG. 2 would be examined to determine whether a contact pad exists in FIG. 2. One of ordinary skill in the art would recognize that the preferred embodiment described reduces the amount of computation necessary from the exhaustive method previously described. That is, once pixels are grouped into larger, rectangular geometrics, it then becomes necessary to only visit the extremes of the so identified areas to identify contact regions.

When rectangular area 208 was examined, pixels H7 would be aligned to the lower left hand corner of the contact pad and pixels F7, F9, and H9 would be checked to determine if each contained conductive material. When a determination is made that each of these pixels does contain conductive material, a contact pad has been identified and a connection between layers can be made. A mask may also be used for this determination. One of ordinary skill in the art would realize that each of the pixels checked does not necessarily reside within the same rectangular group as does the lower left pixel being visited. For example, when rectangular group 208 is examined, pixels from rectangular groups 202 and 203 are included in the examination. The rectangular groupings identified may also overlap without effecting the identification of contact pads.

Similarly, in FIG. 3, areas 301 through 310 may be examined to determine if the lower left corner of each of these areas is included in a potential contact pad area. If this first iteration of examining the lower left corners of each area fails to identify a potential contact pad, in the preferred embodiment, the lower right corner of each of the areas identified is then examined to determine if that element is contained in a contact pad. For instance, referring to FIG. 2, the lower right corner of area 207 is element T17. In order for element T17 to be the lower right hand corner of a three by three contact pad, elements T15, R15 and R17 would each need to contain conductive material. An examination of these specific elements determines that element T17 is not the lower right corner of a potential contact pad.

Figure 4:
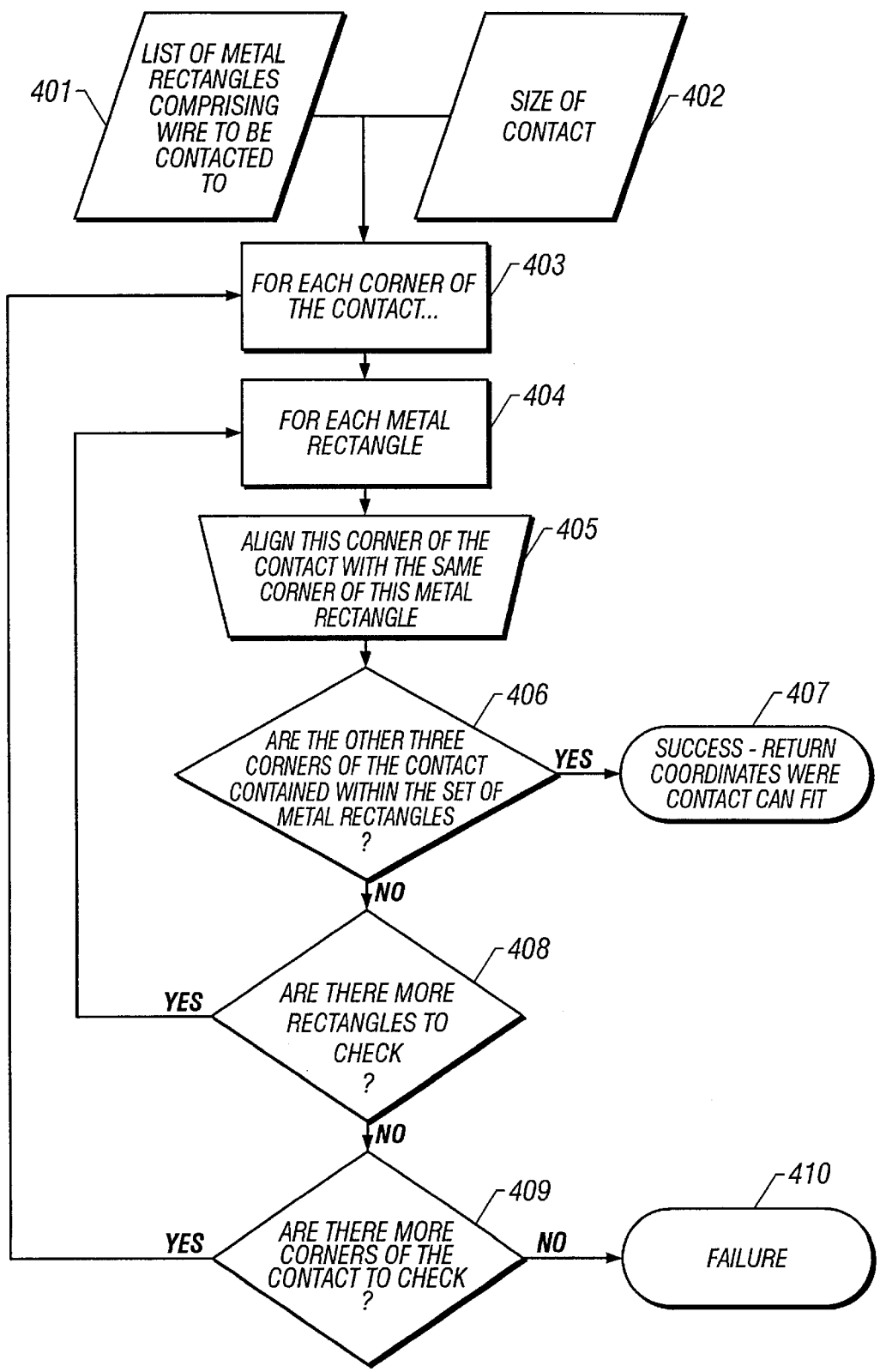
FIG. 4 is a flow chart depicting the methodology of the present invention.

FIG. 4 is a flow chart of the preferred embodiment of the present invention. In step 401, the conductive material present on the level of the circuit board or IC is divided into rectangular areas. These rectangular areas may be of different size, orientation, and may overlap each other without adversely affecting the identification of contact pads. The larger the rectangular areas are, the more efficient the algorithm will operate. However, when the rectangular areas are identified, the rectangles must not contain any pixels which do not contain conductive material. At step 402, the size of the contact pad is identified. In the current example, a three by three contact has been used, although it is apparent that the present invention is applicable to contact pads of any size. Step 403 of FIG. 4 applies each corner of the contact against each metal rectangle in step 404 and aligns the corner of the contact with the same corner of the metal rectangle. For instance, the lower left corner of the possible contact pad geometry would be aligned with the lower left corner of the metal rectangular area being visited.

Alternatively, the upper right corner of the contact pad could be aligned with the upper right hand corner of the metal rectangular area being visited. The groupings of pixels into rectangular areas and the order and number of corners checked are related and may allow the algorithm to operate more efficiently. Once the corner of the potential contact pad is aligned with the same corner of the metal rectangle, the other three corners of the contact are examined to determine if each is contained within the metal rectangle in step 406. If each of the other three corners of the contact are contained a decision is made in step 407 that a contact pad has been identified and the iterative process is halted. If the other three corners of the contact are not included within the metal rectangle, step 408 is reached and a determination is made as to whether there are additional rectangles to be checked for the specific corner of the contact under consideration. If additional metal rectangles are available, these metal rectangles are examined with respect to that specific corner.

Once each rectangle is checked in step 408 with a specific corner, step 409 is reached and a decision is made as to whether additional contact corners are to be checked. If additional contact corners are to be checked, flow is returned to step 403 and an alternate corner of the contact is used to examine each of the metal rectangles. If while in block step 409 each of the corners have been checked, step 410 is reached and a contact pad has not been identified in the conductive material on that layer of the circuit board or IC.

FIG. 5 contains one example of program code that may be used to practice the present invention. Line 500 of FIG. 5 steps the analysis of the program through the various rectangular areas identified on the PCB or IC. These identified rectangles are received by the program as "a" in line. Line 502 sets the first corner examined to be the lower left corner of the contact pad. Lines 503 determine the remaining three corners of the contact pad. If the lower left corner of the contact pad is used as the starting point, the upper left corner is the lower left corner incremented by the height of the contact pad. Similarly, the lower right of the contact pad is the lower left corner incremented by the width of the contact pad. Finally, the upper right hand corner of the contact pad is the lower left corner plus the height and width of the contact pad. This section of the program defines the points which correspond to the four corners of the contact pad using the lower left corner. Similar equations can be determined starting with one of the four corners or points within the contact pad.

The remaining code in FIG. 5 tests to see if each corner contains conductive material so that a contact pad has been identified. Conversely, if at least one of the four corners does not contain conductive material, the next rectangular area is examined.

What is claimed is:

1. A method of identifying a contact pad location comprising the steps of:

apportioning contiguous groups of adjacent pixels containing conductive material of an interconnect layer into rectangular geometric areas of contiguous conductive material;

specifying a size and geometry of a contact pad;

aligning a first corner of a mask corresponding to said contact pad with a corresponding first corner of each of said rectangular areas, and calculating locations of remaining corners of said mask;

determining whether said remaining corners of said mask identify conductive material; and identifying contact pad locations when all four corners of said mask contains conductive material.

2. The method of claim 1 wherein:

said step of apportioning is performed favoring a horizontal alignment of said rectangular areas.

3. The method of claim 2 wherein:

said first corner is the lower left hand corner of said mask.

4. The method of claim 1 further comprising:

aligning a second corner of said mask with a corresponding second corner of said rectangular area.

5. The method of claim 1 further comprising:

iterating said steps of aligning said first corner, calculating locations and determining whether said remaining corners contain conductive material over a number of rectangular areas.

6. A method of identifying a rectangular shape of first dimensions within a plurality of atomic units tiling a plane, comprising the steps of:

grouping contiguously adjacent ones of said atomic units into a plurality of rectangular areas collectively including all of said atomic units;

aligning a mask representing said rectangular shape with ones of said rectangular areas so that a predetermined corner of said mask is aligned with a corresponding corner of ones of said rectangular areas; and identifying locations of mask positions in which all corners of said mask are within one or more of said rectangular areas so as to identify said rectangular shapes.

7. The method of claim 6 wherein:

said atomic units are subject to a minimum spacing requirement wherein non-contiguous ones of said atomic units are spaced apart by said minimum spacing requirement and wherein a maximum size of said mask is based on said minimum spacing requirements.

8. The method of claim 6 wherein:

said plane comprises one of a metal layer of an integrated circuit and an interconnect layer of a printed circuit board.

9. The method of claim 6 wherein:

at least some of said rectangular areas overlap so as to include one or more of the same atomic units.

10. The method of claim 6 wherein:

said atomic units define locations of a conductive layer formed on a substrate.

11. The method of claim 6 further comprising:

step of forming a connection to at least one of said identified locations.

12. The method of claim 6 further comprising:

step of forming a hole through a conductive layer at least one of said identified locations.

13. The method of claim 6 further comprising:

a step of attaching a interlayer wiring element at said identified locations.

14. A design tool executable by a processor, said design tool for identifying contact pad regions of a partially metal region of a substrate, the metal region defined by a plurality of constituent rectangularly shaped blocks of conductive material, said design tool configured to perform:

identifying contiguously adjacent ones of said blocks to form respective groups of rectangular macroblocks of conductive material;

aligning a mask representing said contact pad region with ones of said macroblocks so that a predetermined corner of said mask is aligned with a corresponding corner of said macroblock; and identifying locations of mask positions in which all corners of said mask are within one or more of said macroblocks.

15. The design tool of claim 14 wherein:

said step of aligning a mask is performed for a plurality of corners of said mask.

16. The design tool of claim 14 wherein:

each of the corners of the mask is defined to correspond to one of said constituent rectangularly shaped blocks.

17. The design tool of claim 14 wherein:

said substrate comprising an integrated circuit chip die.

18. The design tool of claim 14 wherein:

said substrate comprising a layer of a printed circuit board.

19. The design tool of claim 14 wherein:

said partially metal region comprises a metal layer of an integrated circuit.

20. The design tool of claim 14 wherein:

said partially metal region comprises an interconnect layer of a printed circuit board.

* * * * *